(12) United States Patent
Hirayama et al.

(10) Patent No.: US 8,278,211 B2
(45) Date of Patent: Oct. 2, 2012

(54) THIN FILM FORMING METHOD

(75) Inventors: Hanako Hirayama, Kawasaki (JP); Eisaku Watanabe, Komae (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 13/004,263

(22) Filed: Jan. 11, 2011

(65) Prior Publication Data

US 2011/0165775 A1    Jul. 7, 2011

Related U.S. Application Data

(63) Continuation of application No. PCT/JP2009/061752, filed on Jun. 26, 2009.

(30) Foreign Application Priority Data

Jul. 11, 2008    (JP) ................................. 2008-181431

(51) Int. Cl.
*H01L 21/44* (2006.01)

(52) U.S. Cl. ................. 438/653; 257/E21.158

(58) Field of Classification Search ................. 438/629, 438/639, 640, 643, 648, 650, 653, 656, 666, 438/668, 685, 686; 204/298.1, 298.06, 298.11, 204/204.12, 298.14; 257/E21.158
See application file for complete search history.

(56) References Cited

U.S. PATENT DOCUMENTS

| | | | |
|---|---|---|---|
| 5,962,923 A | 10/1999 | Xu et al. | 257/774 |
| 6,136,095 A | 10/2000 | Xu et al. | 118/719 |
| 6,217,721 B1 | 4/2001 | Xu et al. | 204/192.17 |
| 6,313,027 B1 | 11/2001 | Xu et al. | 438/627 |
| 7,964,504 B1 * | 6/2011 | Shaviv et al. | 438/680 |
| 2006/0172536 A1 * | 8/2006 | Brown et al. | 438/687 |
| 2010/0009533 A1 * | 1/2010 | Shaviv et al. | 438/653 |
| 2010/0330795 A1 * | 12/2010 | Wang et al. | 438/592 |

FOREIGN PATENT DOCUMENTS

| | | |
|---|---|---|
| JP | 06-168895 A | 6/1994 |
| JP | 06-252065 A | 9/1994 |
| JP | 09-162293 A | 6/1997 |
| JP | 2001-303247 | 10/2001 |
| JP | 2002-363740 | 12/2002 |
| JP | 2004162138 * | 6/2004 |
| JP | 2004-526868 | 9/2004 |
| JP | 2005-285820 | 10/2005 |
| JP | 2007-250624 | 9/2007 |
| WO | WO 02/091461 A2 | 11/2002 |

* cited by examiner

*Primary Examiner* — Julio J Maldonado
*Assistant Examiner* — Robert Bachner
(74) *Attorney, Agent, or Firm* — Fitzpatrick, Cella, Harper & Scinto

(57) ABSTRACT

According to the present invention, a thin film having a desired thickness is formed on an inner sidewall of a step with excellent step coverage in a film forming step and an etching step at least once, respectively. In an embodiment of the present invention, a target material is deposited on a substrate (17) having a concave step (31, 32) having an opening width or opening diameter of 3 μm or less and an aspect ratio of 1 or more. At this time, a film forming method according to the present invention has a first step of depositing a thin film onto a bottom (33) of the step (31, 32) and a second step of forming a film on an inner sidewall (34) of the step (31, 32) by re-sputtering the thin film deposited on the bottom (33) and the pressure in a process chamber in the second step is set lower than that in the process chamber in the first step and the ratio of anode power to cathode power in the second step is set greater than the power ratio in the first step.

9 Claims, 7 Drawing Sheets

FIG. 7
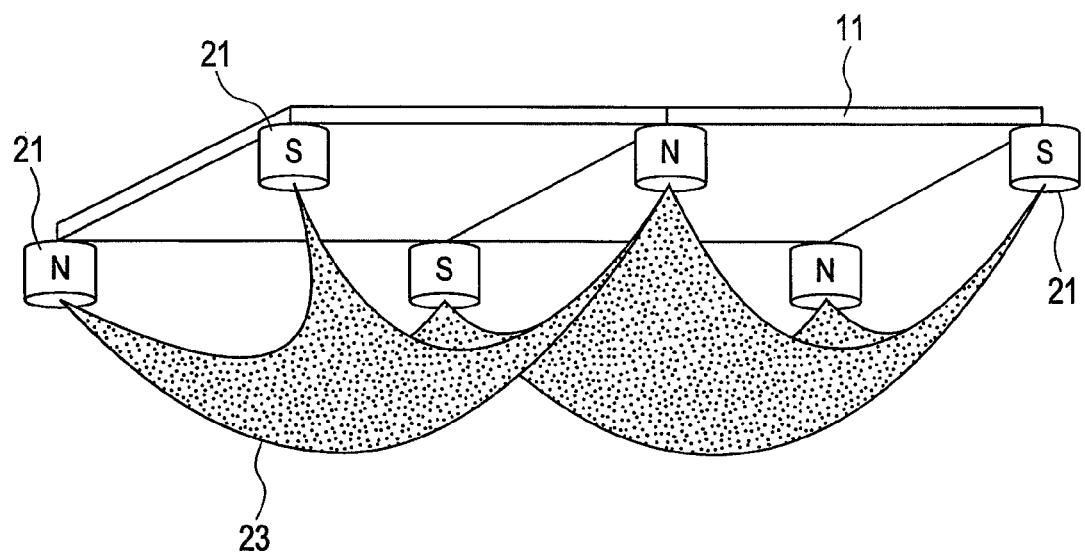
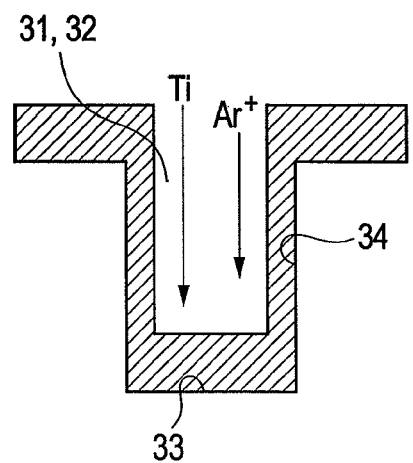
FIG. 8A
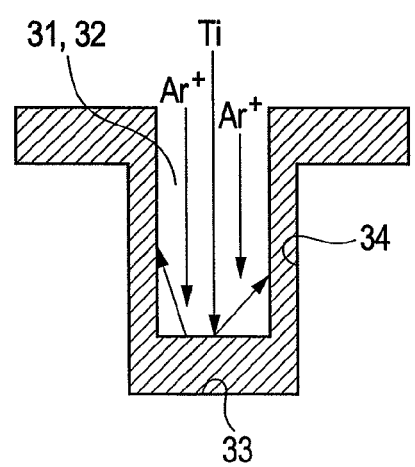
FIG. 8B

THIN FILM FORMING METHOD

CROSS-REFERENCE TO RELATED APPLICATIONS

This application is a continuation application of International Application No. PCT/JP2009/061752, filed Jun. 26, 2009, which claims the benefit of Japanese Patent Application No. 2008-181431, filed Jul. 11, 2008. The contents of the aforementioned applications are incorporated herein by reference in their entireties.

TECHNICAL FIELD

The present invention relates to a thin film forming method such as one in a semiconductor integrated circuit device and, in more detail, to a thin film forming method on a substrate having a trench or via hole that is a step having an opening width or opening diameter of 3 μm or less and an aspect ratio of 1 or more.

BACKGROUND ART

Conventionally, in the field of the semiconductor integrated circuit device etc., various techniques to form a thin film on a substrate with a trench or via hole having an aspect ratio of 1 or more are proposed.

For example, the technique is proposed that prevents the occurrence of voids by forming a barrier film of titanium nitride on the sidewall part and bottom of a trench etc. by reactive ionization sputtering when filling in a trench or via hole having an aspect ratio of 1 or more by reflow (refer to Patent Document 1).

Further, the method of manufacturing an insulating film by ECR plasma CVD is proposed, which enables the reforming of plasma in the vicinity of a substrate, the homogenization of a horizontal film and a vertical film in the step part, and the shape control of the section of the vertical film (refer to Patent Document 2). This method of manufacturing an insulating film is a method of forming a film by alternately repeating the film formation step and sputter step and the magnitude of RF bias is changed between both steps and an etching gas is added in the sputter step.

Furthermore, the method of achieving conformal step coverage on a substrate by PVD is proposed (refer to Patent Document 3). In this method, a signal to be supplied to a target is switched to another alternately at the part of negative voltage and the part of zero voltage during the sputter process and the film deposited on the bottom in the sputter step is redistributed from the bottom to the sidewall in the inverse sputter step. According to this method, it is possible to achieve conformal coverage on the sidewall and bottom of a contact or via having an aspect ratio of 5 or more.

Then, along with high integration of a semiconductor, a technique to form a film in a narrower hole or trench with excellent step coverage is required. For example, the method of forming a silicon dioxide base insulating film in a fine hole or trench having a high aspect ratio with excellent step coverage at low temperature using ECR-plasma CVD is proposed (refer to Patent Document 4).

[Patent Document 1] Japanese Unexamined Patent Application Publication No. 1997-162293
[Patent Document 2] Japanese Unexamined Patent Application Publication No. 1994-252065
[Patent Document 3] Japanese Unexamined Patent Application Publication No. 2001-303247
[Patent Document 4] Japanese Unexamined Patent Application Publication No. 1994-168895

SUMMARY OF INVENTION

Reduction of void is not sufficient even if the reflow technique in Patent Document 1 is used and the flatness of a film after reflow is not sufficient, and therefore, CMP (Chemical Mechanical Polishing) process is required for flattening. Further, it is difficult to coat the sidewall of a trench or via hole with a barrier film having a sufficient thickness. In particular, there used to be such a problem that when a substrate is large such as a wafer of 300 mm or more, it is difficult to coat the sidewall of a trench or via hole located on the periphery thereof completely with a barrier film.

With the technique in Patent Document 2, the above-mentioned problem can be solved, however, the insulating film is formed by ECR plasma CVD, and therefore, the raw material gases that can be used are limited. In principles, it is possible to simultaneously perform the film formation step and the sputter step and it is also possible to form a film by performing the film formation step and the sputter step once, respectively. However, depending on the kind of gas that is used, there is produced a difference in the inner stress between the flat part and the vertical part in a hole or groove, and therefore, this is dealt with by changing the raw material gas. Further, by only one-time film formation step and one-time sputter step, a defect will occur in the shape of a formed film, and therefore, it is necessary to form a film on a part called a seed layer then to suppress the defect in the shape by making the shape correction and as a result, the film formation step and the sputter step need to be performed at least twice, respectively.

With the technique in Patent Document 3, if a film is formed by the first film formation step in a step having an aspect ratio of about 5, quite a few nests and faults are formed in the inner sidewall. This can be thought because of the oblique shadow effect by the step. Further, if a film is attached to a step having an aspect ratio of about 1 in the film formation step, quite a few nests and faults are formed in the inner sidewall. This can be thought because the film is formed by ECR-CVD as in Patent Document 2 and because of the oblique shadow effect by the step. Further, when the opening is small and the aspect ratio is large, even if the thickness of a film formed in the first film formation step is reduced, the opening becomes smaller by the formation of the film on the inner sidewall and it becomes hard for particles for sputtering to enter a hole or trench, leading to such a problem that the performance of sputter action is degraded.

With the technique in Patent Document 4, the opening width or opening diameter of a trench or via hole is limited to 3 μm or more in order to form a film in a trench or via hole having a high aspect ratio with excellent step coverage.

With the above-mentioned circumstances taken into account, the present invention is applied when forming a film on a substrate with a trench or via hole that is a step having an opening width or opening diameter of 3 μm or less and an aspect ratio of 1 or more. At this time, an object of the present invention is to provide a thin film forming method capable of forming a thin film having a desired film thickness on the inner sidewall of a trench or via hole with excellent step coverage in at least one-time film formation step and at least one-time etching step.

In order to achieve the object, the present invention is a thin film forming method which introduces a process gas into a process chamber capable of vacuum evacuation and including a first electrode for supporting the substrate and a second electrode disposed so as to face the substrate for supporting a target, applies different powers to the first and second electrodes, respectively, from high frequency power sources, and at the same time, generates a magnetic field in the second electrode to generate plasma, and deposits a target material onto a substrate having a concave step, the method including: a first step of depositing a thin film on a bottom of the step; and a second step of forming a film on an inner sidewall of the step by re-sputtering the thin film deposited on the bottom of the step, wherein a pressure in the process chamber in the second step is set lower than that in the first step and a ratio of the power supplied to the first electrode to the power supplied to the second electrode in the second step is set greater than the ratio of the power in the first step.

The thin film forming method according to the present invention is applied when forming a thin film on a substrate with a trench or via hole that is a step having an opening width or opening diameter of 3 μm or less and an aspect ratio of 1 or more. At this time, in the first step, a thin film is deposited onto the bottom of the trench or via hole and in the second step, the thin film deposited on the bottom of the trench or via hole is re-sputtered and a film is formed on the inner sidewall of the trench or via hole. Consequently, it is possible to form a thin film having a desired film thickness on the inner sidewall of the trench or via hole with excellent step coverage in at least one-time film formation step and at least one-time re-sputter step (etching step).

BRIEF DESCRIPTION OF THE DRAWINGS

FIG. 7 is a conceptual diagram showing a cusp field generated by a magnet mechanism having a magnet and a top plate according to an embodiment of the present invention.

FIG. 8A is a general explanatory diagram showing how a film is formed in a thin film forming method according to an embodiment of the present invention.

FIG. 8B is a general explanatory diagram showing how a film is formed in the thin film forming method according to an embodiment of the present invention.

DESCRIPTION OF EMBODIMENTS

Figure 1:
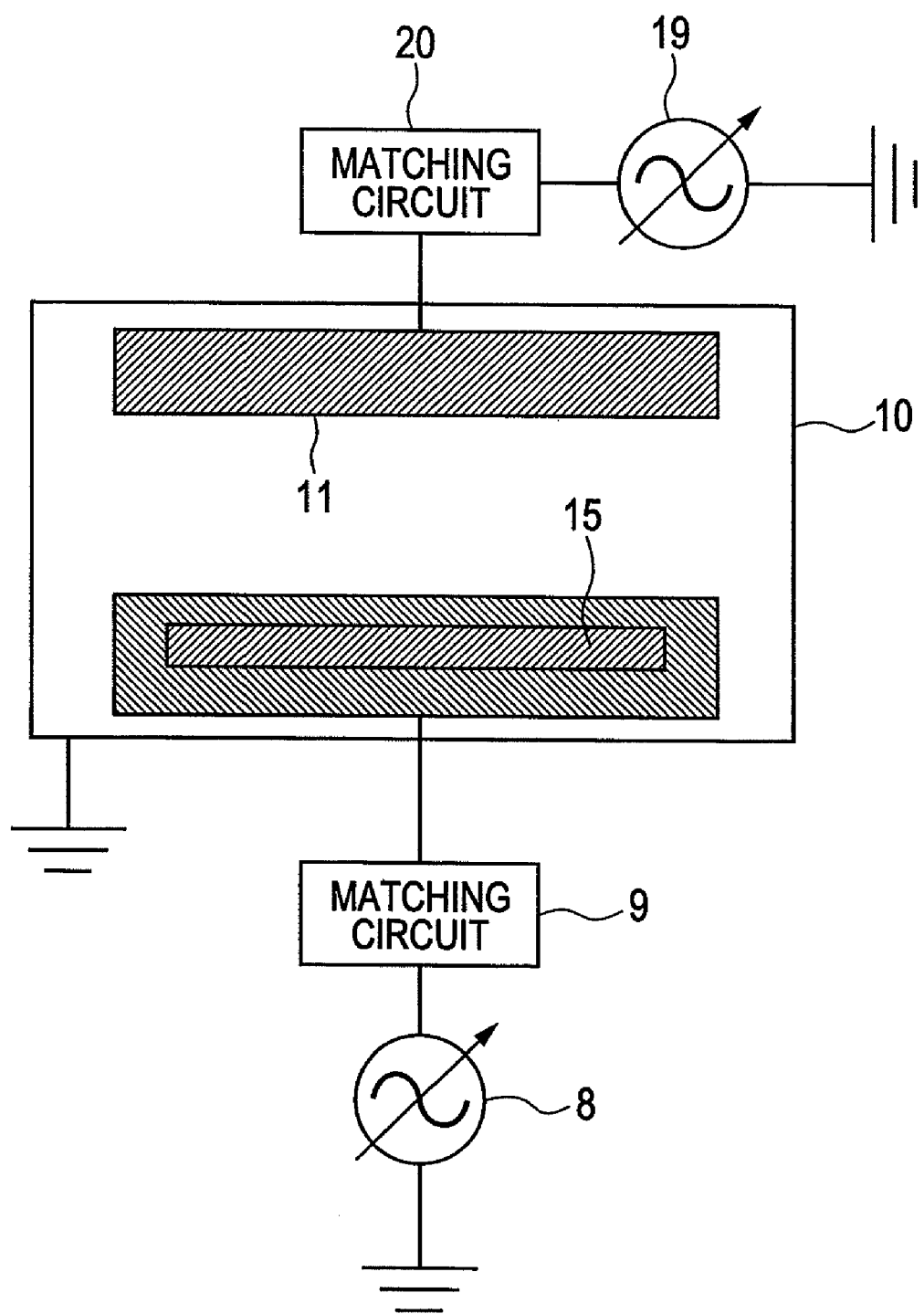
FIG. 1 is a schematic diagram illustrating a plasma processing device that performs a thin film forming method according to an embodiment of the present invention.

With reference to the drawings, embodiments of the present invention will be described below, and the present invention is however not limited to the embodiments. In the drawings explained below, the same reference numeral is attached to a component having the same function and its repetitive explanation is omitted.

Figure 2:
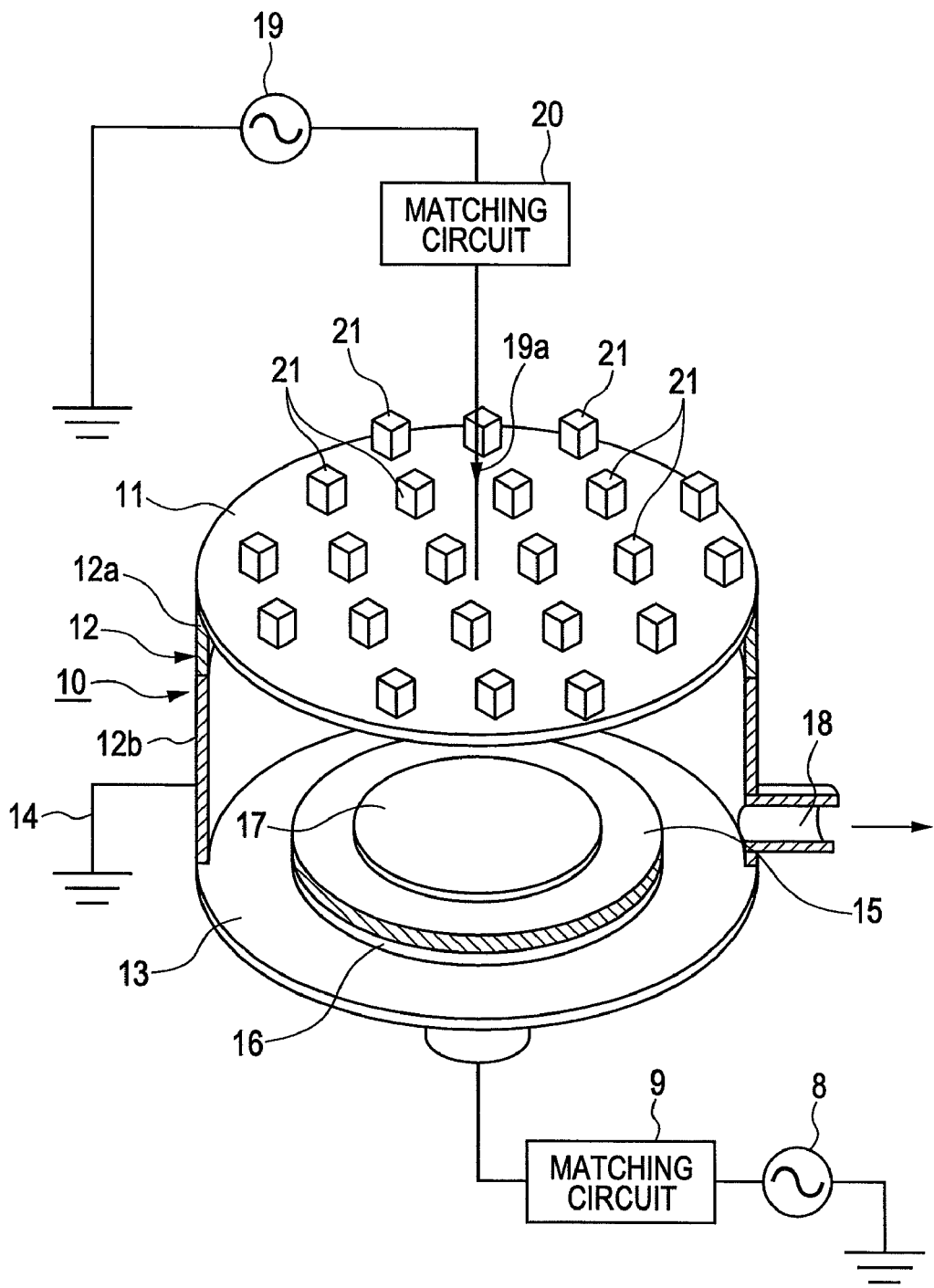
FIG. 2 is a general diagram showing a structure at an upper wall (outside) of the plasma processing device shown in FIG. 1 and its inside structure.
Figure 3:
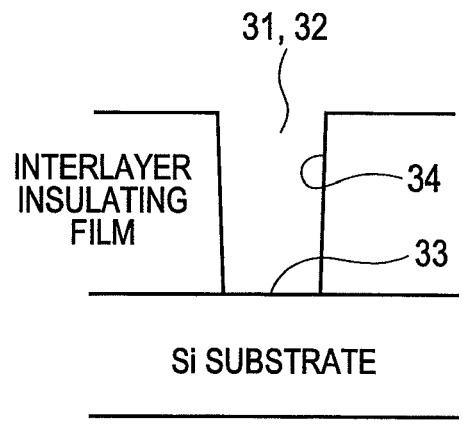
FIG. 3 is a general diagram showing the shape of a section of a substrate according to an embodiment of the present invention.

First, with reference to FIG. 1 to FIG. 3, the configuration of a plasma processing device that performs a method of forming a thin film according to the present invention is explained. FIG. 1 is a schematic diagram illustrating the plasma processing device that performs the thin film forming method according to the present embodiment. FIG. 2 is a general diagram showing a structure at an upper wall (outside) of the plasma processing device shown in FIG. 1 and its inside structure. FIG. 3 is a general diagram showing the shape of a section of a substrate.

As shown in FIG. 1 and FIG. 2, in the present embodiment, as a plasma processing device to form a thin film on a substrate 17, for example, a magnetron sputtering device is illustrated. The sputtering processing device in the present embodiment comprises a reaction vessel 10 capable of vacuum evacuation as a process chamber and further comprises an anode electrode (first electrode) 15 that functions also as a substrate holder supporting the substrate 17 and a cathode electrode (second electrode) 11 disposed so as to face the substrate 17 and supporting a target, not shown schematically, within the reaction vessel 10. The cathode electrode 11 is also referred to as a top plate. In this sputtering process, a process gas is introduced into a process chamber in the reaction vessel 10 and different powers are applied to the cathode electrode 11 and the anode electrode 15 from high frequency power sources 19, 8 and at the same time, a cusp field is formed in the cathode electrode 11. Due to this, the sputtering device generates plasma in the process chamber and forms a thin film of a target material on the substrate 17.

To an exhaust port 18 of the reaction vessel 10, an exhaust device such as an exhaust pump is connected via a conductance valve etc., not shown schematically. To the reaction vessel 10, a gas introduction system 25 comprising a flow rate controller, a valve, etc., is connected as a process gas introducing means and the process gas is introduced at a predetermined flow rate from the gas introduction system 25 (refer to FIG. 4).

As the process gas of the present embodiment, it is possible to use a single gas or a mixed gas including at least a noble gas (inert gas) such as argon (Ar) and krypton (Kr). When performing reactive sputtering, it is possible to use a mixed gas of a noble gas such as Ar and Kr and a reactive gas including oxygen and nitrogen. At least one kind of the reactive gas is selected for use from a gas group consisting of oxygen and nitrogen.

The reaction vessel 10 includes the top plate (cathode electrode) 11, a cylindrical sidewall 12, and a bottom plate (substrate holder) 13. A lower part 12b of the cylindrical sidewall 12 and the bottom plate 13 are formed by stainless steel or a metal such as aluminum (Al). An upper part 12a of the cylindrical sidewall 12 is formed from ceramic (dielectric material). The top plate 11 has the shape of a flat circular plate and formed from, for example, a nonmagnetic metal such as Al.

The top plate 11 is mounted on the upper part 12a of the cylindrical sidewall 12, and therefore, electrically insulated from other parts of the reaction vessel 10. The top plate 11 functions as a cathode electrode when generating plasma. The cathode electrode 11 is connected to the high frequency power source 19 capable of applying a variable voltage via a matching circuit 20. To the cathode electrode 11, necessary high frequency power is supplied from the high frequency power source 19. On the top (back surface) of the cathode electrode 11, a magnet mechanism configured by a plurality of magnets 21 is disposed. By providing the magnet mechanism, it is possible to form plasma in a high density. Typically, this magnet mechanism has a structure in which magnets having different polarities are arranged at respective vertexes of a rectangle, generating a cusp field. Details of the magnet mechanism are described later.

As the material of the target supported at the front surface (undersurface, that is, the surface facing the substrate 17) of the cathode electrode 11, it is possible to use a material of single composition, for example, tantalum (Ta), copper (Cu), titanium (Ti), etc., and it is also possible to use a material of compound composition including two or more compositions such as GeSbTe and NiFe. Among the target materials, Ta or Cu is a non-magnetic material and on the other hand, NiFe is a magnetic material.

Note that, the diameter of the upper part 12a of the cylindrical sidewall 12 is the same as that of the lower part 12b. The value of the diameter is not an important issue and can be varied between 40 cm and 60 cm. Other values may be accepted. The height of the ceramic part 12a of the cylindrical sidewall 12 is also not important and in a range between 1 cm and 5 cm. It is needless to say that other values may be accepted. The lower part 12b of the cylindrical sidewall 12 and the bottom plate 13 are electrically grounded via a ground line 14. The diameter of the top plate 11 corresponds to the diameter of the cylindrical sidewall 12.

In the inner space of the reaction vessel 10, the substrate holder 15 that functions as the anode electrode 15 attached onto the bottom plate 13 is disposed. The substrate holder 15 is connected to the high frequency power source 8 capable of applying a variable voltage via, for example, a matching circuit 9. The high frequency power source 8 is disposed outside the reaction vessel 10.

The substrate 17 to be processed in the reaction vessel 10 is held on the substrate holder 15 by a substrate holding mechanism such as a holding device of electrostatic adsorption type etc., not shown schematically. The substrate holder 15 is disposed in parallel with the bottom plate 13 and electrically insulated from the reaction vessel 10 by an insulator 16. The substrate holder 15 is, for example, a holding table in the shape of a circular plate and includes a holding mechanism such as an electrode for electrostatic adsorption, not shown schematically. The substrate holder 15 mounts the substrate 17 on the top surface thereof and the substrate 17 is held by the holding mechanism with its surface to be processed facing upward.

It may also be possible to form the substrate holder 15 so as to be capable of rotating in an in-plane direction of the substrate 17 by a rotating mechanism such as a motor, not shown schematically. It is preferable for the substrate holder 15 to incorporate a heating mechanism such as a heater, not shown schematically. The temperature of the substrate in the present embodiment can be set, for example, in a temperature range from −90° C. to +900° C.

As the substrate 17, for example, mention is made of a semiconductor wafer and the substrate 17 is held by the substrate holder 15 in a state of being the substrate alone or in a state of being mounted on a tray. As shown in FIG. 3, the substrate 17 has a trench 31 or a via hole 32 that is a concave step having an opening width or opening diameter of 3 μm or less and an aspect ratio (depth/opening width or opening diameter) of 1 or more. Hereinafter, the trench 31 or the via hole 32 is sometimes referred to simply as a step. The trench 31 or the via hole 32 has a bottom 33 and an inner sidewall 34. As the substrate 17, it is possible to use a single crystal semiconductor substrate such as a silicon wafer, a glass substrate having a non-single crystal silicon film such as a polycrystal silicon film, fine crystal silicon film, and amorphous silicon film, and a compound semiconductor substrate such as GaAs. Further, the substrate 17 may be one in which various elements, for example, a transistor, capacitor, photoelectric conversion element, etc., are provided.

Figure 4:
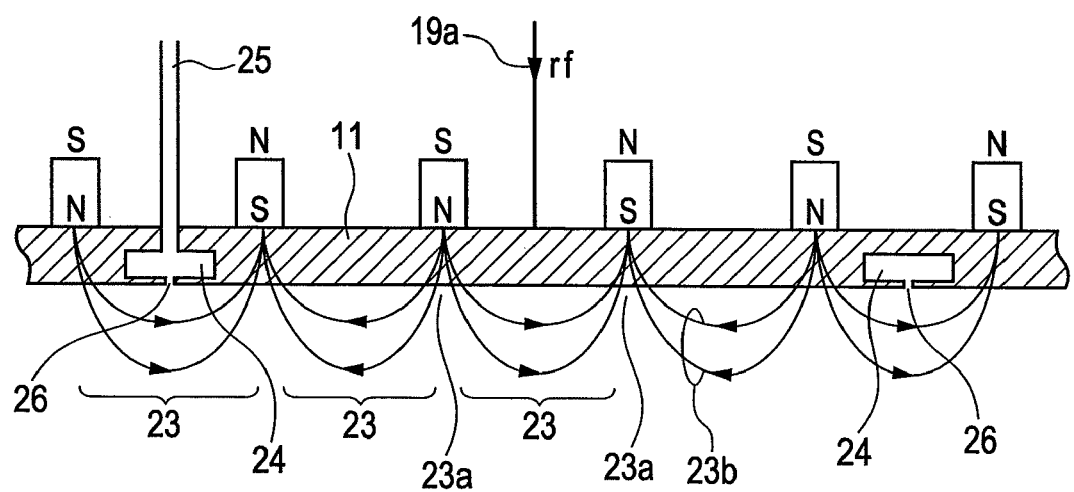
FIG. 4 is a partial section view of a top plate showing a magnetic field of a magnet of a plasma processing device according to an embodiment of the present invention.
Figure 5:
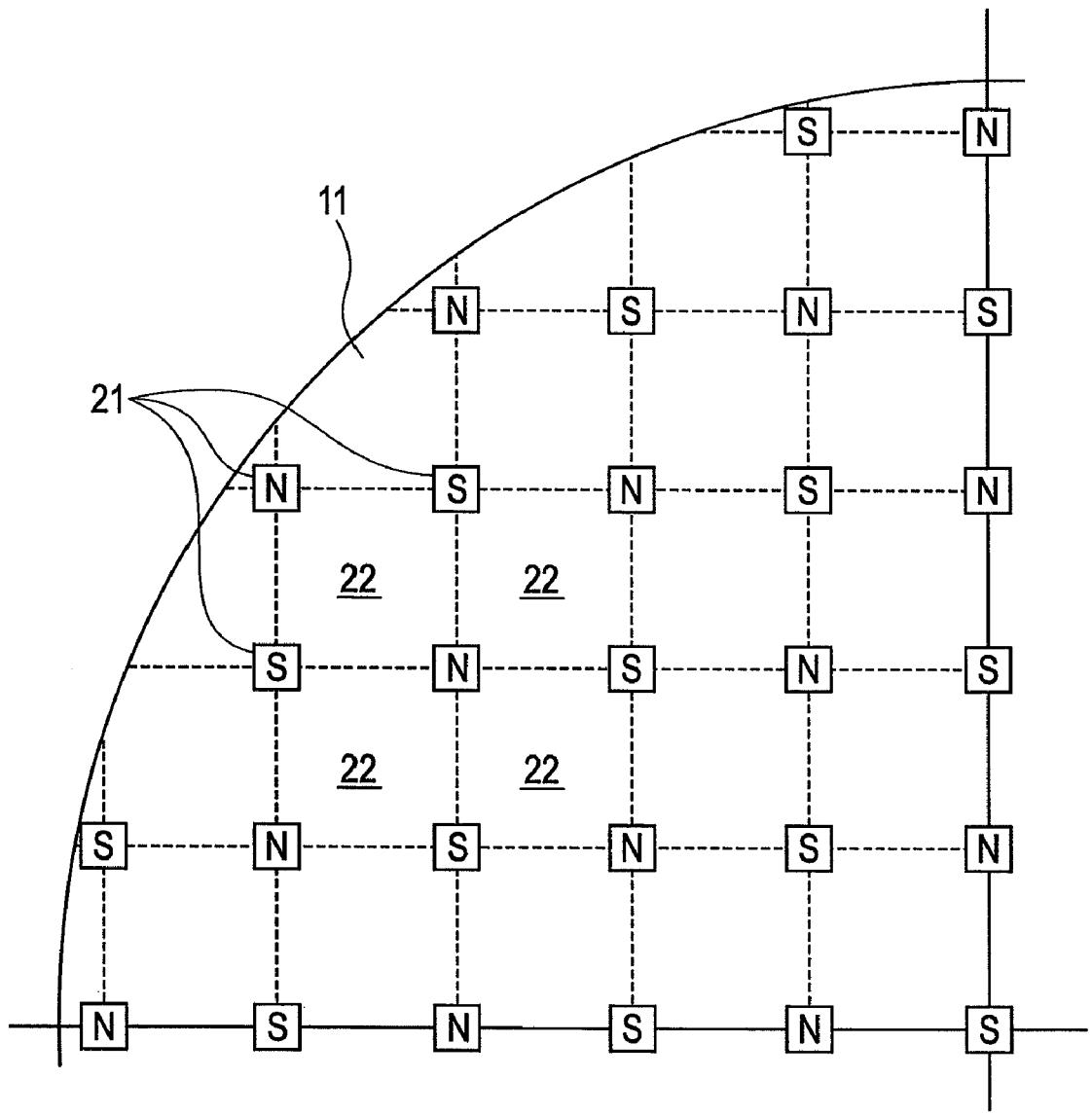
FIG. 5 is a plan view of a quarter region of a top plate showing an array (I) of a magnet according to an embodiment of the present invention.
Figure 6:
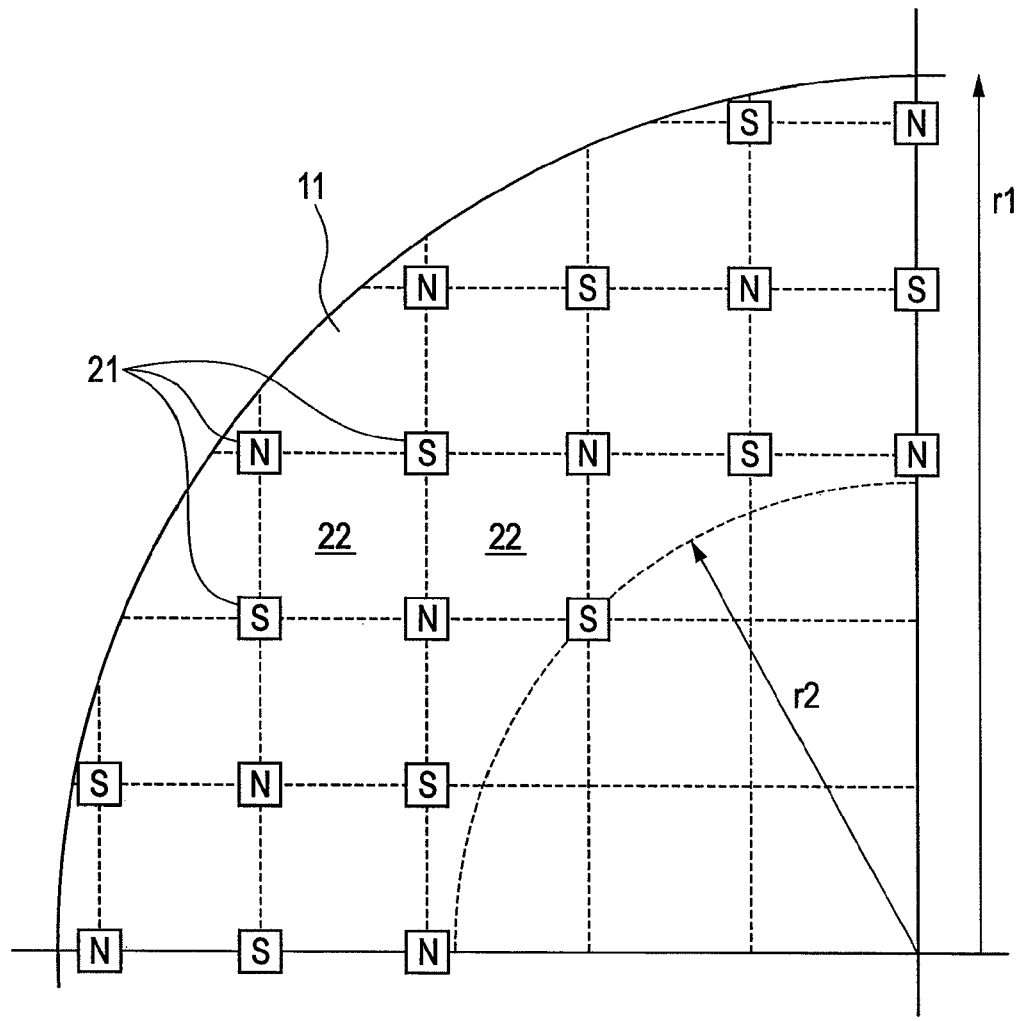
FIG. 6 is a plan view of a quarter region of a top plate showing an array (II) of a magnet according to an embodiment of the present invention.

Next, with reference to FIG. 4 to FIG. 7, the magnet mechanism arranged on the top plate 11 is explained in detail. FIG. 4 is a partial section view of the top plate showing the magnetic field of the magnet of the plasma processing device according to the present embodiment. FIG. 5 is a plan view of a quarter region of the top plate showing an array (I) of the magnet according to the present embodiment. FIG. 6 is a plan view of a quarter region of the top plate showing an array (II) of the magnet according to the present embodiment. FIG. 7 is a conceptual diagram showing a cusp field generated by the magnet mechanism having the magnet and the top plate shown in FIG. 5.

As shown in FIG. 4 to FIG. 7, a plurality of the magnets 21 is arranged on the top plate 11 and further fixed on the outside surface of the top plate 11. The magnets 21 are arranged in a symmetrical positional relation, and therefore, in FIG. 5 and FIG. 6, only the quarter region of the top plate 11 is shown in the state of being a plan view.

The magnet 21 is arranged on the outside surface of the top plate 11 so as to generate a cusp field 23 inside the top plate 11. In this case, to be strict, the cusp field 23 is referred to as a point-cusp field determined by the four magnets 21. In the present description, a "point-cusp field" refers to the formation of a closed cusp field by the four magnets 21 neighboring each other as shown in FIG. 7.

Only one requirement to form a point-cusp field is that the magnets 21 neighboring each other must have opposite polarities at the poles facing the top plate 11. This means that the polarities of the magnets toward the inside of the reaction vessel 10 change alternately. For example, as shown in FIG. 5, the magnets 21 are arranged at respective corners of a rectangle 22 drawn by a dotted line on the top plate 11. In FIG. 5 and FIG. 6, N and S denote the magnetic polarities of the magnet 21. The separation (distance) between any two of the neighboring magnets 21 is not important and can be changed in a range from 2 cm to 10 cm depending on the intensity of the magnet 21 and the diameter of the top plate 11. It is needless to say that other values may be accepted.

As shown in FIG. 4, the array of the magnets 21 forms the point-cusp field 23 together with a cusp 23a formed between the two neighboring magnetic fields 23 under the top plate 11. Reference numeral 23b denotes a line of magnetic flux. The line of magnetic flux 23b that exits from the magnetic pole curves toward the opposite magnetic pole closest directly thereto. In this manner, the point-cusp field 23 is formed. The point-cusp field 23 generated in the space near the inside surface of the top plate 11 forms the line of magnetic flux 23b closed so as to form a loop. In the vicinity of the inside surface of the top plate 11, a number of magnetic flux loops are formed and as a result the cusp 23a of a magnetic field is formed. The homogeneity of plasma under the top plate 11 changes depending on the array structure formed by the magnets 21 on the top plate 11. That is, it is possible to control the homogeneity of plasma generated under the top plate 11 by the array structure of the magnets 21 arranged so as to form the cusp field.

It is preferable for the shape of the magnet 21 to be a cube or cylinder the sectional shape of which is a rectangle or circle, respectively. Each of the magnets 21 is arranged in a hole formed on the outside surface of the top plate 11. For example, the thickness of the top plate 11 is about 20 mm and the depth of the hole is about 17 mm. Consequently, the surface of the bottom of the magnet 21 is in close proximity to the inner space of the reaction vessel 10.

The sectional shape of the magnet 21 is circular or rectangular. When the sectional shape of the magnet 21 is circular, its diameter falls within a range from 10 mm to 40 mm. However, the value of the diameter is not important. When the sectional shape of the magnet 21 is rectangular, a dimension corresponding to that of the magnet having a circular sectional shape is selected. The height of the magnet 21 is also not important and preferably within a range from 3 mm to 10 mm. The magnetic intensity of the magnet 21 is selected so as to have a magnetic intensity of about 50 Gauss to 500 Gauss under the top plate 11. It is needless to say that the magnetic intensity can be beyond this range.

In addition, as shown in FIG. 4, a circular gas passage 24 is formed within the top plate 11. The circular gas passage 24 is coupled to a gas supply source (not shown schematically) through the gas introduction system 25 and has a plurality of gas introduction holes 26 in the inside surface of the top plate 11. The process gas supplied from the gas supply source is introduced into the inner space of the reaction vessel 10 through the circular gas passage 24 and the gas introduction hole 26. The process gas is supplied first to the circular gas passage 24 and then introduced into the process chamber of the reaction vessel 10 through the several gas introduction holes 26.

The internal pressure of the reaction vessel 10 is controlled by adjusting the flow rate of the gas and adjusting a well-known variable orifice (not shown schematically) disposed in the gas exhaust port 18. The internal pressure (pressure in the process chamber) of the reaction vessel 10 is varied in a range, for example, from 0.2 Pa to 27 Pa. In the present embodiment, in the thin film forming method according to the present invention, to be described later, the pressure in the process chamber in the second step is set lower than that in the process chamber in the first step. The specific pressure that is set in the process chamber is described in detail in the explanation of the thin film forming method according to the present invention.

In the present embodiment, the frequency of the high frequency power source 19 that supplies power to the cathode electrode 11 is in a range from about 10 MHz to 300 MHz. On the other hand, the frequency of the high frequency power source 8 that supplies power to the anode electrode 15 is in a range from about 1 MHz to 15 MHz.

Further, in the present embodiment, in the thin film forming method according to the present invention, to be described later, the ratio of the anode power to the cathode power in the second step is set greater than the ratio of the anode power to the cathode power in the first step. Specific settings of power ratios are described in detail in the thin film forming method according to the present invention. It may also be possible to use the anode electrode 15 in the state of being grounded.

Next, the mechanism of the generation of plasma in the reaction vessel 10 including the previously described plasma source is explained. In FIG. 4, when a high frequency current 19a is supplied from the high frequency power source 19 to the cathode electrode 11, plasma is generated by the mechanism of electrostatic coupling of high frequency powers. At this time, electrons in the plasma receive the cyclotron rotation based on the existence of the point-cusp field 23 formed by the magnet 21 arranged on the cathode electrode 11. This increases the length of the passage of electrons, causing a higher ratio of ionization than that of the process gas. In addition, the collision of electrons and ions to the cathode electrode 11 is partially suppressed by the point-cusp field 23. Hence, the existence of the cusp field 23 results in an increase in the density of plasma.

Figure 9:
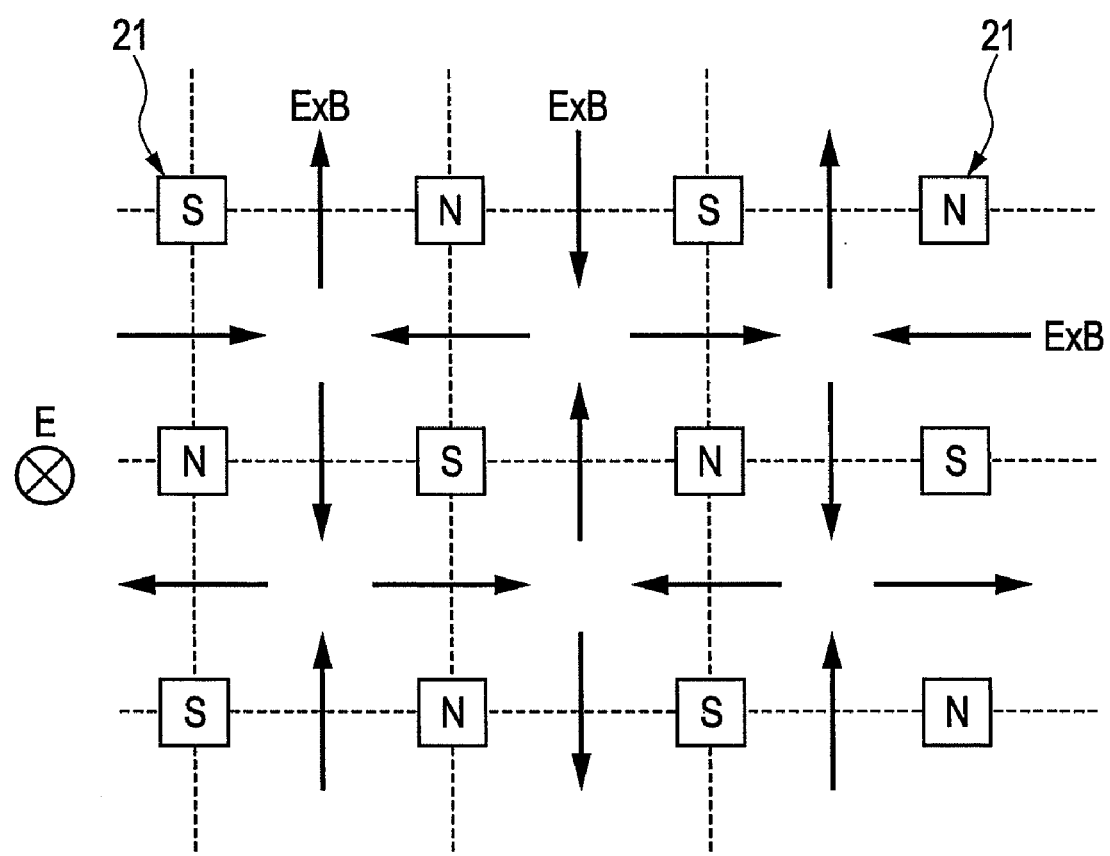
FIG. 9 is an arrangement diagram showing a state of magnetic fields and electric fields when magnets shown in FIG. 7 are arranged.

FIG. 9 shows the directions of the cyclotron rotation and motion in the vertical plane formed by the magnetic fields and electric fields, and the electric fields and magnetic fields when the closed cusp field 23 is formed by the four neighboring magnets 21 shown in FIG. 7.

In general, when no magnetic field exists, the plasma formed between two parallel plates by the mechanism of the electrostatic coupling has higher homogeneity in the radial direction. When a magnetic field exists, the homogeneity of plasma changes. The magnet 21 arranged on the cathode electrode 11 forms the point-cusp field 23 under the cathode electrode 11. In the position where the intensity of the cusp field 23 that exists in parallel with the cathode electrode 11 is at its maximum, the plasma density is at its maximum. Similarly, in the position where the intensity of the cusp field 23 that exists in parallel with the top plate 11 is at its minimum, the plasma density is low. Because of this, in the vicinity of the cathode electrode 11, the plasma density is at its maximum and its minimum. However, the position where the plasma density is at its maximum and the position where it is at its minimum are close to each other, and therefore, diffusion forms the homogeneity of the plasma at a short distance from the cathode electrode 11 on the downstream side. Further, the magnets 21 are arranged so that the polarities change alternately, and therefore, the line of magnetic flux 23b of the point-cusp field 23 curves at a short distance from the inside surface of the cathode electrode 11. Hence, at a short distance from the cathode electrode 11, an environment without magnetic field can be obtained.

For the purpose of obtaining a homogeneous plasma density, it may also be possible to find another array of the magnets 21 different from the previously described configuration. For example, it is possible to increase the interval between two neighboring magnets in the vicinity of the center part of the cathode electrode 11 greater than that between two neighboring magnets in the vicinity of the periphery, or it is also possible to remove the magnet at the center part. Here, the magnets 21 are arranged in the form of a band (as a band) only in the positions in close proximity to the circumferential edge part of the cathode electrode 11. In FIG. 6, a radius r1 is the radius of the cathode electrode (top plate) 11 and a radius r2 is the radius of a circular region in which magnets are not arranged. This array reduces the number of the magnets 21 in the vicinity of the center part of the top plate 11 smaller than the number of those at a part nearer to the circumferential edge part. That is, the magnetic flux density at the center part and its circumferential edge of the top plate 11 becomes lower than that at the part nearer to the circumferential edge part.

Next, with reference to FIG. 1 to FIG. 3 again and to FIGS. 8A, 8B, the thin film forming method according to the present invention is explained along with the operation of the above-mentioned plasma processing device. FIGS. 8A, 8B are general explanatory diagrams showing how a film is formed in the thin film forming method according to the present invention. In the present embodiment, as a target that is supported by the cathode electrode 11, titanium (Ti) is used and as a process gas, Ar is introduced into the reaction vessel 10.

That is, in the thin film forming method according to the present embodiment, first, the interior of the reaction vessel 10 is evacuated to a predetermined degree of vacuum by an exhaust system. Power is supplied to a heater, not shown schematically, incorporated in the substrate holder (anode electrode) 15 and the substrate holder 15 is heated to a set temperature.

Next, a gate valve, not shown schematically, disposed at the sidewall of the reaction vessel 10 is opened and a substrate transfer path is opened. In this state, by using a transfer arm such as a robot arm, not shown schematically, the substrate 17 is transferred onto the top surface of the substrate holder 15. Then, the substrate holder 15 is caused to hold the substrate 17 by a holding mechanism, not shown schematically. After causing the transfer arm to retreat, the gate valve is closed.

After the heating time until the surface temperature of the substrate 17 reaches a predetermined temperature (for example, 900° C.), a process gas is introduced at a predetermined flow rate from the gas introduction system 25. Further, the internal pressure of the reaction vessel 10 is adjusted arbitrarily by a conductance valve etc. in the exhaust system, not shown schematically.

After the process gas is introduced, different powers are applied to the above-mentioned electrodes 11, 15 from the high frequency power sources 19, 8 and at the same time, a cusp field is generated in the cathode electrode 11 to generate plasma. By the generation of the plasma, a thin film of a target material is formed on the substrate 17 having the trench 31 or the via hole that is a step having an opening width or opening diameter of 3 μm or less and an aspect ratio of 1 or more.

As described above, the thin film forming method according to the present embodiment is applied when forming a thin film on the substrate 17 having the trench 31 or the via hole that is a step having an opening width or opening diameter of 3 μm or less and an aspect ratio of 1 or more. When forming a thin film, the plasma processing device according to the present embodiment performs a first step of depositing a thin film on the bottom 33 of the trench 31 or the via hole and a second step of forming a film on the inner sidewall 34 of the trench 31 or the via hole 32 by re-sputtering the thin film deposited on the bottom 33. When forming a film within the trench or the via hole 32, the above mentioned first and second steps are performed in this order at least once or more, respectively.

In the present embodiment, the pressure in the process chamber in the second step is set lower than that in the process chamber in the first step. Specifically, in the first step, the pressure in the process chamber is selected and set in a range from 2 Pa to 27 Pa and in the second step, the pressure is selected and set in a range from 0.2 Pa to 2 Pa lower than that in the first step. An appropriate pressure is determined depending on the type of application.

Further, in the present embodiment, the ratio of the anode power to the cathode power (anode power/cathode power) in the second step is set greater than the ratio of the anode power to the cathode power in the first step. In the first step, it is desirable to set the ratio of the anode power to the cathode power to 0.5 or less in the first step and to set the ratio of the anode power to the cathode power to 1 or more in the second step.

Under the condition of the above-mentioned power ratios, the power of the high frequency power source 19 supplied to the cathode electrode 11 is selected and set in a range from 300 W to 10,000 W and the power of the high frequency power source 8 supplied to the anode electrode 15 is selected and set in a range from 0 W to 2,000 W. Specifically, when the diameter (size) of the substrate 17 is 8 in., it is desirable to set the cathode power in a range from 300 W to 5,000 W and the anode power from 0 W to 600 W in the first step. On the other hand, it is desirable to set the cathode power from 300 W to 800 W and the anode power from 500 W to 1,000 W in the second step.

When the diameter (size) of the substrate 17 is 12 in., it is desirable to set the cathode power from 500 W to 10,000 W and the anode power from 0 W to 1,200 W in the first step. On the other hand, it is desirable to set the cathode power from 500 W to 1,000 W and the anode power from 1,000 W to 2,000 W in the second step.

As can be seen from the lower limit (0 W) of the anode power, it may also be possible to use the anode electrode 15 in the state of being grounded.

As shown in FIG. 8A, in the first step, a thin film is deposited on the bottom 33 of the trench 31 or the via hole 32. As shown in FIG. 8B, in the second step, the thin film deposited on the bottom 33 of the trench 31 or the via hole 32 is re-sputtered and a film is formed on the inner sidewall 34 of the trench 31 or the via hole 32. Consequently, it is possible to form a thin film having a desired film thickness on the inner sidewall 34 with excellent step coverage in at least one-time film formation step and at least one-time sputter step (etching step), respectively.

It is preferable for the ratio of the minimum film thickness of the inner sidewall 34 to the film thickness on the bottom 33 of the trench or the via hole 32 to be 0.5 or less. Preferably, the film thickness of the thin film adhered to the bottom 33 and the inner sidewall 34 of the trench 31 or the via hole 32 is 1 nm to 30 nm.

Further, it is possible to control the film thickness of the bottom 33 and the inner sidewall 34 of the trench 31 or the via hole 32 by adjusting the duration of the second step. Furthermore, it is also possible to completely remove the film on the bottom 33 coated in the first step by comparatively lengthen the duration of the second step in which re-sputter (etching) is dominant. At this time, the component etched from the bottom 33 adheres to the inner sidewall 34 again.

After a film having a predetermined thickness is deposited, the power supply from the high frequency power sources 8, 19 is terminated. Further, the introduction of the process gas from the gas introduction system 25 is terminated and the interior of the reaction vessel 10 is evacuated by opening the conductance valve etc. in the exhaust system.

Next, the gate valve is opened to open the substrate transfer path, the transfer arm is inserted to hold the substrate 17, and the transfer arm is caused to retreat to transfer the substrate 17 out of the reaction vessel 10. Finally, the gate valve is closed and all the steps are completed. It may also be possible to move to the next step such as a reflow step without interruption.

As described above, in the thin film forming method according to the present embodiment, while forming a film on the substrate 17 by target particles that come flying from the target, a bias is applied to the anode electrode 15 on which the substrate 17 is placed. Due to this, noble gas ions in the plasma generated between the anode electrode 15 and the cathode electrode 11 are pulled to the anode electrode 15 and re-sputtered (etched) with the substrate 17 as a target. Consequently, the change in film quality is not so considerable as that when caused by the ECR plasma CVD. Further, only by setting the ratio of the anode power to the cathode power in the second step greater than the power ratio in the first step, it is possible to form the trench 31 or the via hole into a desired shape by performing the steps once, respectively. In the second step, it is possible for the film formation step and the etching step to act at the same time.

In the present embodiment, the process gas contains a noble gas, and therefore, it is possible to maintain the film quality. Further, the frequency of the high frequency power source 19 of the cathode electrode 11 is set in a range from 10 MHz to 300 MHz. Because of this, in the first step, it is possible to form a film at a high ionization rate, and therefore, a large amount of film is attached to the bottom 33 of the trench 31 or the via hole 32 (step) and hardly attached to the inner sidewall 34. In the second step, it is possible to increase the plasma density by applying a low power and the film formation by the target can be ignored. Then, on the cathode electrode 11, the magnet mechanism to form a cusp field is mounted. Hence, in the first step, a film is formed at a high ionization rate, and therefore, a large amount of film is attached to the bottom 33 and hardly attached to the inner sidewall 34. In the second step, it is possible to increase the plasma density by applying a low power and the film formation by the target can be ignored.

In addition, the pressure in the process chamber in the first step is as high as 2 Pa to 27 Pa compared to that of another sputter, and therefore, the ionization rate becomes high and a large amount of film is attached to the bottom 33 of the step and hardly attached to the inner sidewall 34. Further, it is possible to obtain the same step coverage performance in any position of the substrate 17.

According to the present invention, by making variable the ratio of the power of the anode high frequency power source to the power of the cathode high frequency power source, it is made possible to perform the processing (first step) in which film formation is dominant and the processing (second step) in which etching is dominant in one process chamber.

As explained above, according to the present invention, it is possible to form a barrier film having a sufficient thickness on both the bottom 33 and the inner sidewall 34 of the trench 31 or the via hole 32 having an opening width or opening diameter of 3 μm or less and an aspect ratio of 1 or more, in particular, 1.5 or more. As a result, when Al reflow in the next step is performed, it is possible to form a very flat Al film without producing a void in the trench 31 or the via hole 32. Consequently, it is possible to omit the flattening processing such as chemical mechanism polishing (CMP).

Although, the present invention is explained below in detail by mentioning embodiments as examples, the present invention is not limited to these embodiments.

First Example

A silicon substrate in which a plurality of trenches having an aspect ratio of 2.857 (hole diameter=0.35 μm; hole depth 1.0 μm) is arranged was prepared and a tantalum nitride film was formed on the substrate using the plasma processing device in FIG. 1.

Tantalum (Ta) was used as a target that is supported by the cathode electrode 11 and a mixed gas of Ar and $N_2$ was introduced into the reaction vessel 10 as a process gas.

In the first step, in the atmosphere of the mixed gas of Ar and $N_2$ (pressure in the process chamber: 22 Pa), 2.5 kW high frequency power of 60 MHz was applied to the cathode electrode 11 and 0.1 kW high frequency power of 13.56 MHz was applied to the anode electrode 15 including the substrate 17 and thus the processing was performed.

The plasma density increases as the pressure in the process chamber, the cathode power, and the cathode RF frequency increase and decreases as they decrease. Because of this, if the frequency of the high frequency power source 19 is set to 10 MHz to 300 MHz, the cathode power is increased, and the pressure in the process chamber in the first step is set to 2 Pa to 27 Pa, the ionization rate is increased and a large amount of film is attached to the bottom of the step and attached hardly to the side surface.

To the anode electrode 15, a self-bias voltage or a bias by the high frequency power source 8 is applied and Ar ions etch the top of the substrate 17. However, because of the high-density plasma, the amount of film formed on the bottom 33 of the trench 32 by Ta is large. Consequently, the influence by Ar ions etching the top of the substrate is substantially ignorable. Further, in the present invention, such a magnet mechanism that generates a point-cusp field is mounted, and therefore, it is made possible to form plasma in a high density compared to normal magnetron sputter. Consequently, by increasing the pressure in the process chamber, the cathode power, and the cathode RF frequency, it is made possible to form higher-density plasma, and to attach a large amount of film to the bottom of the step, and hardly attach to the side surface.

In the second step, the pressure in the process chamber is set to a range from 0.2 Pa to 2 Pa, which is lower than the pressure in the first step. At the same time, in the second step, the ratio of the anode power to the cathode power is set greater than the power ratio in the first step. Consequently, the cathode power is reduced compared to that in the first step, and therefore, low-density plasma is formed. Due to this, the Ar ions re-sputter (etch) the film deposited on the bottom of the trench 32 by the bias of the anode electrode 15 and redistribute the film on the inner sidewall 34.

In the second step, by setting the cathode power in a region in which particles hardly exit from the target (region not sputtered), Ta hardly exits from the Ta target. Because of this, Ta hardly forms a film again on the bottom 33 of the trench 32 by a bias. In this manner, it is possible to increase the plasma density by applying a low power and the film formation by the target can be ignored.

In the second step, while the application of the high frequency power to the cathode electrode 11 and the anode electrode 15 was continued from the first step, the introduction of $N_2$ of the above-mentioned mixed gas into the process chamber was terminated and the Ar atmosphere was formed (pressure in the process chamber: 1 Pa). At the same time, 0.8 kW high frequency power of 60 MHz was applied to the cathode electrode 11 and 0.9 kW high frequency power of 13.56 MHz was applied to the anode electrode 15.

After the film was formed within the trench 32 in this manner and how the film is formed was observed by a scan type electronic microscope, the deposition of a thin film onto the bottom 33 of the trench 32 was observed in the first step (bottom: 0.110 μm, inner sidewall: 0.025 μm). In the second step, the thickness of the film on the bottom 33 of the trench 32 was reduced and the thickness of the film on the inner sidewall 34 was increased (bottom: 0.060 μm, inner sidewall: 0.760 μm).

Comparative Examples 1, 2

A tantalum nitride film was formed in the same manner as that in the first example except in that the reaction conditions were changed as shown in Table 1.

In the comparative example 1, the power ratio satisfies the requirements of the present invention, however, the pressure is higher in the second step than that in the first step and does not satisfy them. As a result, the Ar ions collide with one another more frequently in the second step and the rate at which the film deposited on the bottom 33 of the trench 33 is re-sputtered (etched) is reduced considerably. Because of this, in order to obtain a desired shape, the number of times of the second step to be performed is increased and in addition thereto, the film quality is degraded.

In the comparative example 2, although the pressure satisfies the requirements of the present invention, the power ratio is higher in the first step than that in the second step and does not satisfy the requirements of the present invention. As a result, because of the high-density plasma, the amount of film formed by Ta on the bottom 33 of the trench 32 is large. Hence, a film is not deposited on the inner sidewall 34 even if the second step is repeatedly performed a number of times and a desired shape is not obtained even after a long time elapses.

TABLE 1

|  |  | First example | Comparative example 1 | Comparative example 2 |
|---|---|---|---|---|
| First step | Pressure in process chamber [Pa] | 22 | 22 | 22 |
|  | Cathode power [kw] | 2.5 | 2.5 | 2.5 |
|  | Anode power [kw] | 0.1 | 0.1 | 0.1 |
|  | Anode power/cathode power | 0.04 | 0.04 | 0.04 |
| Second step | Pressure in process chamber [Pa] | 1 | 30 | 1 |
|  | Cathode power [kw] | 0.8 | 0.8 | 4.5 |
|  | Anode power [kw] | 0.9 | 0.9 | 0.05 |
|  | Anode power/cathode power | 1.125 | 1.125 | 0.011 |
| Repetition times of second step |  | 1 | 100 times or more | 100 times or more |

Second Example

A silicon substrate on which a plurality of stepwise trenches having two steps (trench opening width=0.60 μm; trench bottom width=0.2 μm; hole depth 0.60 μm) is arranged was prepared and a titanium tungsten alloy film was formed on the substrate using the plasma processing device in FIG. 1.

As a target that is supported by the cathode electrode 11, a titanium tungsten alloy (TiW) was used and the Ar gas was introduced into the reaction vessel 10 as a process gas.

In the first step, processing was performed in the Ar gas atmosphere (pressure in the process chamber: 20 Pa) by applying 4.0 kW high frequency power of 60 MHz to the cathode electrode 11 and applying 0.1 kW high frequency power of 13.56 MHz to the anode electrode 15 including the substrate 17.

The plasma density increases as the pressure in the process chamber, the cathode power, and the cathode RF frequency increase and decreases as they decrease. Therefore, if the frequency of the high frequency power source 19 is set to 10 MHz to 300 MHz and the cathode power is increased, the pressure in the process chamber in the first step is set to 2 Pa to 27 Pa, the ionization rate is increased and a large amount of film is attached to the bottom of the step and hardly attached to the side surface.

Although, to the anode electrode, a self-bias voltage or a bias by the high frequency power source 8 is applied and Ar ions etch the top of the substrate 17, because of the high-density plasma, the amount of film formed on the bottom of the trench by TiW is large. Consequently, the influence by Ar ions etching the top of the substrate is substantially ignorable. Further, in the present invention, such a magnet mechanism that generates a point-cusp field is mounted, and therefore, it is made possible to form plasma in a high density compared to normal magnetron sputter. Consequently, by increasing the pressure in the process chamber, the cathode power, and the cathode RF frequency, it is made possible to form higher-density plasma, and to attach a large amount of film to the bottom of the step, and hardly attach to the side surface.

In the second step, the pressure in the process chamber is set to a range from 0.2 Pa to 2 Pa, which is lower than that in the first step. At the same time, in the second step, the ratio of the anode power to the cathode power is set greater than the power ratio in the first step. Consequently, the cathode power is reduced compared to that in the first step, and therefore, low-density plasma is formed. Due to this, the Ar ions re-sputter (etch) the film deposited on the bottom of the trench by the bias of the anode electrode 15 and redistribute the film on the inner sidewall.

In the second step, by setting the cathode power in a region in which particles hardly exit from the target, TiW hardly exits from the TiW target. Hence, TiW hardly forms a film again on the bottom of the trench by a bias. In this manner, it is possible to increase the plasma density by applying a low power and the film formation by the target can be ignored.

In the second step, while the application of the high frequency power to the cathode electrode 11 and the anode electrode 15 was continued from the first step, the Ar atmosphere was continued (pressure in the process chamber: 1.5 Pa). At the same time, 0.5 kW high frequency power of 60 MHz was applied to the cathode electrode 11 and 0.5 kW high frequency power of 13.56 MHz was applied to the anode electrode 15.

After the film was formed within the trench in this manner and how the film is formed was observed by a scan type electronic microscope, the deposition of a thin film onto the bottom of the trench was observed in the first step. In the second step, the thickness of the film on the bottom of the trench was reduced and the thickness of the film on the inner sidewall was increased.

Comparative Examples 3, 4

A titanium tungsten alloy film was formed in the same manner as that in the second example except in that the reaction conditions were changed as shown in Table 2.

In the comparative example 3, although the power ratio satisfies the requirements of the present invention, the pressure is higher in the second step than that in the first step and does not satisfy them. As a result, the Ar ions collide with one another more frequently in the second step and the rate at which the film deposited on the bottom of the trench is re-sputtered (etched) is reduced considerably. Because of this, in order to obtain a desired shape, the number of times of the second step to be performed is increased and in addition thereto, the film quality is degraded.

In the comparative example 4, although the pressure satisfies the requirements of the present invention, the power ratio is higher in the first step than that in the second step and does not satisfy the requirements of the present invention. As a result, because of the high-density plasma, the amount of film formed by TiW on the bottom of the trench is large. Hence, a film is not deposited on the inner sidewall even if the second step is repeatedly performed a number of times and a desired shape is not obtained even when a long time elapses.

TABLE 2

|  |  | Second example | Comparative example 3 | Comparative example 4 |
|---|---|---|---|---|
| First step | Pressure in process chamber [Pa] | 20 | 20 | 20 |
|  | Cathode power [kw] | 4.0 | 4.0 | 4.0 |
|  | Anode power [kw] | 0.1 | 0.1 | 0.1 |
|  | Anode power/cathode power | 0.025 | 0.025 | 0.025 |
| Second step | Pressure in process chamber [Pa] | 1.5 | 30 | 1.5 |
|  | Cathode power [kw] | 0.5 | 0.5 | 4.5 |
|  | Anode power [kw] | 0.5 | 0.5 | 0.05 |

TABLE 2-continued

|  | Second example | Comparative example 3 | Comparative example 4 |
|---|---|---|---|
| Anode power/cathode power | 1 | 1 | 0.011 |
| Repetition times of second step | 1 | 100 times or more | 100 times or more |

Not only to the sputtering device illustrated above, the present invention can also be applied to a plasma processing device, such as a dry etching device, plasma asher device, CVD device, and liquid crystal display manufacturing device.

The invention claimed is:

1. A thin film forming method in which a process chamber including a first electrode for supporting a substrate; a second electrode disposed so as to face the substrate for supporting a target; and a plurality of magnets arranged on a surface facing a surface that supports the target of the second electrode wherein the magnets are arranged in positions corresponding to the respective corners of a plurality of rectangles linked in a checkered pattern and the polarities of the magnets neighboring in a direction of the side of the respective rectangles are opposite to each other, is used to deposit a target material onto a substrate having a concave step, wherein the magnets form a line of magnetic flux closed so as to form a loop in space near the surface that supports the target of the second electrode to form a point-cusp field, and different high frequency powers are applied to the first and second electrodes, respectively, from high frequency power sources to generate plasma under the second electrode, the method comprising:

a first step of depositing a thin film on a bottom of the step; and a second step of forming a film on an inner sidewall of the step by re-sputtering the thin film deposited on the bottom of the step, wherein the first step selects and sets a pressure in the process chamber in a range from 2 Pa to 27 Pa, sets a ratio of the power supplied to the first electrode to the power supplied to the second electrode to 0.5 or less, sets the frequency of the high frequency power source supplied to the second electrode to a range from 10 MHz to 300 MHz, and thereby generates high-density plasma under the second electrode to deposit a thin film on the bottom of the step, and the second step sets the power supplied to the second electrode lower than that of the first step selects and sets a pressure in the process chamber in a range from 0.2 Pa to 2 Pa, sets a ratio of the power supplied to the first electrode to the power supplied to the second electrode to 1 or more, and thereby generates low-density plasma under the second electrode and re-sputters the thin film deposited on the bottom of the step to form a film on the inner sidewall of the step.

2. A thin film forming method according to claim 1, wherein a ratio of the minimum film thickness on the inner sidewall to the film thickness on the bottom of the step is 0.5 or less.

3. A thin film forming method according to claim 1, wherein the high frequency power of the high frequency power source supplied to the second electrode is selected and set in a range from 300 W to 10,000 W and the high frequency power of the high frequency power source supplied to the first electrode is selected and set in a range from 0 W to 2,000 W.

4. A thin film forming method according to claim 1, wherein the first step and the second step are performed in this order at least once, respectively, when forming a film within the step.

5. A thin film forming method according to claim 1, wherein the second electrode is configured by a material of a single composition or compound compositions having conductivity.

6. A thin film forming method according to claim 1, wherein the process gas is a gas containing at least a noble gas.

7. A thin film forming method according to claim 6, wherein the process gas is a mixed gas of a noble gas and a reactive gas and the reactive gas is at least one kind of gas selected from a gas group consisting of oxygen and nitrogen.

8. A thin film forming method according to claim 6, wherein different process gases are used in the first step and the second step.

9. A thin film forming method according to claim 1, wherein the high frequency power of the high frequency power source supplied to the second electrode is selected and set in a range from 300 W to 10,000 W and the high frequency power of the high frequency power source supplied to the first electrode is set to 0 W.

* * * * *